United States Patent
Day et al.

(10) Patent No.: US 7,826,503 B2
(45) Date of Patent: Nov. 2, 2010

(54) EXTENDED TUNING IN EXTERNAL CAVITY QUANTUM CASCADE LASERS

(75) Inventors: Timothy Day, Poway, CA (US); Miles James Weida, Poway, CA (US)

(73) Assignee: Daylight Solutions, Inc., San Diego, CA (US)

( * ) Notice: Subject to any disclaimer, the term of this patent is extended or adjusted under 35 U.S.C. 154(b) by 139 days.

(21) Appl. No.: 12/204,256

(22) Filed: Sep. 4, 2008

(65) Prior Publication Data

US 2009/0225802 A1    Sep. 10, 2009

Related U.S. Application Data

(63) Continuation of application No. 11/525,387, filed on Sep. 22, 2006, now Pat. No. 7,424,042.

(51) Int. Cl.
*H01S 3/04* (2006.01)
*H01S 3/08* (2006.01)

(52) U.S. Cl. .............................. 372/36; 372/34; 372/92

(58) Field of Classification Search .................. 372/34, 372/36, 43.01, 92
See application file for complete search history.

(56) References Cited

U.S. PATENT DOCUMENTS

| | | | |
|---|---|---|---|
| 4,656,641 A | 4/1987 | Scifres et al. | |
| 4,796,266 A | 1/1989 | Banwell et al. | |
| 5,050,176 A | 9/1991 | Naito et al. | |
| 5,068,867 A | 11/1991 | Hasenberg et al. | |
| 5,082,339 A | 1/1992 | Linnebach | |
| 5,082,799 A | 1/1992 | Holmstrom et al. | |
| 5,140,599 A | 8/1992 | Trutna, Jr. et al. | |
| 5,172,390 A | 12/1992 | Mooradian | |
| 5,181,214 A | 1/1993 | Berger et al. | |
| 5,331,651 A | 7/1994 | Becker et al. | |
| 5,457,709 A | 10/1995 | Capasso et al. | |
| 5,537,432 A | 7/1996 | Mehuys et al. | |
| 5,662,819 A | 9/1997 | Kadomura | |
| 5,752,100 A | 5/1998 | Schrock | |

(Continued)

FOREIGN PATENT DOCUMENTS

JP    03-048480 A    3/1991

(Continued)

OTHER PUBLICATIONS

International Search Report and Written Opinion for PCT/US2007/79135 (related to present application), published Dec. 10, 2008, Daylight Solutions, Inc.

(Continued)

*Primary Examiner*—Armando Rodriguez
(74) *Attorney, Agent, or Firm*—Roeder & Broder LLP

(57) ABSTRACT

In a semiconductor lasers using quantum well gain medium, a quantum well stack is mounted in an epi-down configuration. The epitaxial side of the device may be directly bonded to an efficient heat transport system so that heat may more easily leave the quantum well stack layers and be disposed at a heatsink. Such a device runs cooler and exhibits reduced loss mechanisms as represented by a laser system loss-line. External cavity systems using this configuration may permit a high degree of tunability, and these systems are particularly improved as the tuning range is extended by lowered cavity losses.

24 Claims, 10 Drawing Sheets

U.S. PATENT DOCUMENTS

| | | | |
|---|---|---|---|
| 6,134,257 | A | 10/2000 | Capasso et al. |
| 6,243,404 | B1 | 6/2001 | Joyce |
| 6,326,646 | B1 | 12/2001 | Baillargeon |
| 6,400,744 | B1 | 6/2002 | Capasso et al. |
| 6,483,978 | B1 | 11/2002 | Gao et al. |
| 6,553,045 | B2 | 4/2003 | Kaspi |
| 6,575,641 | B2 | 6/2003 | Yamabayashi et al. |
| 6,636,539 | B2 | 10/2003 | Martinsen |
| 6,782,162 | B2 | 8/2004 | Fukuzawa et al. |
| 6,856,717 | B2 | 2/2005 | Kilian |
| 6,859,481 | B2 | 2/2005 | Zheng |
| 7,032,431 | B2 | 4/2006 | Baum et al. |
| 7,061,022 | B1 | 6/2006 | Pham et al. |
| 7,088,076 | B2 | 8/2006 | Densham et al. |
| 2001/0036210 | A1 | 11/2001 | Salomaa |
| 2002/0064198 | A1 | 5/2002 | Koizumi |
| 2002/0090013 | A1 | 7/2002 | Murry et al. |
| 2002/0150133 | A1 | 10/2002 | Aikiyo et al. |
| 2002/0176473 | A1 | 11/2002 | Moordian |
| 2003/0043877 | A1 | 3/2003 | Kaspi |
| 2003/0095346 | A1 | 5/2003 | Nasu et al. |
| 2003/0198274 | A1 | 10/2003 | Lucchetti |
| 2004/0013154 | A1 | 1/2004 | Zheng |
| 2004/0208602 | A1 | 10/2004 | Plante |
| 2004/0228371 | A1 | 11/2004 | Kolodzey et al. |
| 2004/0238811 | A1 | 12/2004 | Nakamura et al. |
| 2004/0264523 | A1 | 12/2004 | Posamentier |
| 2005/0199869 | A1 | 9/2005 | Zhisheng |
| 2005/0213627 | A1 | 9/2005 | Masselink et al. |
| 2006/0056466 | A1 | 3/2006 | Belenky et al. |
| 2007/0030865 | A1 | 2/2007 | Day et al. |
| 2007/0291804 | A1 | 12/2007 | Day et al. |

FOREIGN PATENT DOCUMENTS

| JP | 07-024322 B | 1/1995 |
|---|---|---|

OTHER PUBLICATIONS

International Preliminary Report on Patentability for PCT/US2007/79135 (related to present application), Apr. 2, 2009, Daylight Solutions, Inc.

S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland (provided in parent U.S. Appl. No. 11/525,387).

Gaetano Scamarcio, Mid-IR and THz Quantum Cascade Lasers, 2005, Physics Dept., University of Bari, Bari Italy (provided in parent U.S. Appl. No. 11/525,387).

Gaetano Scamarcio et al., Micro-probe characterization of QCLs correlation with optical performance, APL 78, 1177 & APL 78, 2095 (2001), APL 2002, APL 2004, University of Bari, Bari Italy (provided in parent U.S. Appl. No. 11/525,387).

J. Faist, THz and Mid-IR Quantum cascade lasers, QM in space, Chatillon, Mar. 31, Science 2002, University of Neuchatel, EU Projects Answer/Teranova; Agilent, Funding Swiss National Science Foundation (provided in parent U.S. Appl. No. 11/525,387).

Joel M. Hensley, Recent Updates in QCL-based Sensing Applications, Sep. 5-10, 2006, Physical Sciences, Inc., Andover, MA, 2nd International Workshop on Quantum Cascade Lasers, Ostuni, Italy (provided in parent U.S. Appl. No. 11/525,387).

L. Hildebrandt et al., Quantum cascade external cavity and DFB laser systems in the mid-infrared spectral range: devices and applications, 2004, Marburg Germany (provided in parent U.S. Appl. No. 11/525,387).

Richard Maulini et al., Broadly tunable external cavity quantum-cascade lasers, 2005, University of Neuchatel, Neuchatel Switzerland (provided in parent U.S. Appl. No. 11/525,387).

Victor Rudometov, Eugene Rudometov, Peltier Coolers, pp. 1-11, 1997-2004, Vontage The Broadband Phone Company, www.digit-life.com/article/peltiercoolers, Copyright by Digit-Life.com (provided in parent U.S. Appl. No. 11/525,387).

T.Topfer, K.P. Petrov, Y. Mine, D. Jundt, R.F. Curl and F.K. Tittel, Room-temperature mid-infrared laser sensor for trace gas detection, Oct. 20, 1997, pp. 8042-8049, vol. 36 No. 30, Applied Optics (provided in parent U.S. Appl. No. 11/525,387).

Cavity Enhancing Sensors Using QC Lasers, Nov. 23, 2004, pp. 1-6, infrared.phl.gov/enhanced.sensors. htm, Webmaster: Pamela Kinsey (provided in parent U.S. Appl. No. 11/525,387).

Frequency Modulation, Transient FM Absorption Spectroscopy, Jun. 7, 2005, pp. 1 and 2, www.chem/tamu.edu/rgroup/north/FM.html (provided in parent U.S. Appl. No. 11/525,387).

FM Spectroscopy With Tunable Diode Lasers, Application Note 7, Copyright 2001, pp. 1-10, New Focus, San Jose, CA US (provided in parent U.S. Appl. No. 11/525,387).

John Andrews and Paul Dallin, Frequency Modulation Spectroscopy, pp. 24-26, www.spectroscopyeurope.com, 24 Spectroscopy Europe (provided in parent U.S. Appl. No. 11/525,387), Feb. 2004.

R.F. Curl and F.K. Tittel, Tunable Infrared Laser Spectroscopy, Annu. Rep. Prog. Chem. Sect C, 2002, pp. 219-272, Departments of Chemistry and Electrical and Computer Engineering, Rice Quantum Institute, Rice University, Houston, TX 77005 US (provided in parent U.S. Appl. No. 11/525,387).

Shawn Wehe, David Sonnenfroh, Mark Allen (Physical Sciences, Inc.), Claire Gmachi and Federico Capasso (Bell Laboratories, Lucent Technologies); AIAA 2002-0824 Measurements of Trace Pollutants in Combustion Flows Using Room-Temperature, Mid-IR Quantum Cascade Lasers, Meeting and Exhibit Jan. 14-17, 2002, cover and pp. 1-7, Physical Sciences, Inc., Bell Laboratories, Lucent Technologies, Murray Hill, NJ US (provided in parent U.S. Appl. No. 11/525,387).

W. Huang, R.R.A. Syms, J. Stagg and A.A. Lohmann, Precision MEMS Flexure Mount for a Littman tunable external cavity laser, Mar. 2004, pp. 67-75, vol. 151, No. 2, IEE Prc-Sci Meas. Technology (provided in parent U.S. Appl. No. 11/525,387).

K. Namjou, S. Cai, E.A. Whitaker, J. Faist, C. Gmachi, F. Capasso, D.L. Silvo and A.Y. Cho, Sensitive absorption spectroscopy with a room-temperature distributed feedback quantum-cascade laser, 1998, pp. 219-221, Optical Society of America (provided in parent U.S. Appl. No. 11/525,387).

G.E. Hall, S.W. North, Transient Laser Frequency Modulation Spectroscopy, Copyright 2000, 51:243-74, Annu. Rev. Phys. Chem. (provided in parent U.S. Appl. No. 11/525,387).

External-cavity quantum-cascade lasers, May 11, 2005, pp. 1-4, www.unine.ch/phys/meso/EC/EC.html (provided in parent U.S. Appl. No. 11/525,387).

A.A. Koserev, F.K. Tittel, R. Kohler, C. Gmachi, F. Capasso, D.L. Sivco, A.Y. Cho, S. Wehe and M. Allen, Thermoelectrically cooled quantum cascade laser based sensor for continuous monitoring of ambient atmospheric CO, Copyright 2002, cover and pp. 1-16, Optical Society of America (provided in parent U.S. Appl. No. 11/525,387).

R.A. Syms and A. Lohmann, MOEMS Tuning Element for a Littrow External Cavity Laser, Dec. 6, 2003, IEEE, vol. 12, pp. 921-928, Journal of Microelectromechanical Systems (provided in parent U.S. Appl. No. 11/525,387).

Santa Chawla, Frequency stabilization of diode lasers, May 30, 2005, pp. 1-17, www.ias, ac.in/currsci/jan25/artilces.41.htm, National Physical Laboratory, New Delhi 110 012 India (provided in parent U.S. Appl. No. 11/525,387).

Tsekoun, A. et al; "Improved performance of QCL's through a scalable, manufacturable expitaxial-side-down mounting process", Feb. 2006 (provided in parent case U.S. 10/525,387).

Pushkarsky M. et al.; "Sub-parts-per-billion level detection of NO2 using room temp. QCLs"; May 2006 (provided in parent case U.S. Appl. No. 11/525,387).

Wirtz, D. et al.; "A tuneable heterodyne infrared spectrometer"; Physikalisches Institut; University of Koln; Koln Germany Spectrochimica 2002 (provided in parent U.S. Appl No. 11/525,387).

Williams, B. et al.; "Terahertz QCLs and Electronics";PhD-MIT 2003 (provided in parent case U.S. Appl. No. 11/525,387).

Hensley, J.M. et al.; Demonstration of an External Cavity Terahertz Quantum Cascade Laser, Copyright 2005, Optical Society of America, Washington, DC 20036 (provided in parent case U.S. Appl. No. 11/525,387).

Hildebrandt, L. et al, "Quantum Cascade external cavity and DFB laser systems in the mid-infrared spectral range: devices and applications" Sacher Lasertechnik Group; Marburg, Germany, Copyright 2005, Optical Society of America (provided in parent case U.S. Appl. No. 11/525,387).

Extended Search Report for European Patent Application No. 07842955.2 (related to present application), May 3, 2010, Daylight Solutions, Inc.

G. Totschig et al., Mid-infrared external-cavity quantum-cascade laser XP-001161786, Oct. 15, 2002, pp. 1788-1790, Optics Letters/ vol. 27, No. 20, ©2002 Optical Society of America.

G.P. Luo et al., Grating-tuned external-cavity quantum-cascade semiconductor lasers, May 7, 2001, Applied Physics Letters, vol. 78, No. 19, ©2001 American Institute of Physics.

G. Wysocki et al., Widely tunable mode-hop free external cavity quantum cascade laser for high resolution spectroscopic applications, Jul. 27, 2005, Applied Physics, B81, pp. 769-777, Applied Physics B Lasers and Optics.

Day at al, Miniaturized External Cavity Quantum Cascade Lasers for Broad Tunability in the Mid-Infrared, May 21, 2006, 1-55752-813-6, Lasers and Electro-Optics and 2006 Quantum Electronics and Laser Science Conference, ©2006 IEEE.

Thierry Aellen et al., Continuous-wave distributed-feedback quantum-cascade lasers on a Peltier cooler, Sep. 8, 2003; pp. 1929-1931, Applied Physics Letters: vol. 83: No. 10, ©2003 American Institute of Physics.

D. Weidman et al., Development of a compact quantum cascade laser spectrometer for field measurements of $CO_2$ isotopes, Feb. 1, 2005, pp. 255-260, Applied PhysicsB, Lasers and Optics, Appl. Phys. B 80, published online Sep. 29, 2004 © Springer-Verlag 2004.

EXTENDED TUNING IN EXTERNAL CAVITY QUANTUM CASCADE LASERS

CROSS-REFERENCE TO RELATED APPLICATIONS

This application is a continuation of U.S. application Ser. No. 11/525,387 filed on Sep. 22, 2006, now U.S. Pat. No. 7,424,042 and entitled "Extended Tuning in External Cavity Quantum Cascade Lasers". As far as is permitted, the contents of U.S. application Ser. No. 11/525,387 is incorporated herein by reference.

BACKGROUND

1. Field

The following disclosure is generally concerned with semiconductor laser type optical sources and more specifically concerned with high performance tunable laser oscillators having quantum well type gain media.

2. Related Technology

An optically pumped quantum well laser having wide tunability range is presented by Kaspi in U.S. Pat. No. 6,553,045. Inventor Kaspi presents structures which permit simultaneous lasing on two wavelengths and wavelength selection performed by 'external' means.

Another external cavity QCL system is presented in a CLEO paper titled: "Quantum cascade external cavity laser systems in the midinfrared spectral range" by Hildebrandt et al, published 2004 by the Optical Society of America. In this presentation, mention specific to anti-reflection coatings effect on the tunable nature of QCLs combined with external cavity elements is made. Hildebrandt also introduces an ECQCL in an abstract of paper titled: "Quantum cascade external cavity and DFB laser systems in the mid IR spectral range: devices and applications" published by the Optical Society of America, 2004.

QCL pioneer Faist, published a summary document with very specific description relating to QCLs in various configurations including single mode tuning of some DFB devices. In addition, one section is directed to "broadband and external cavity" arrangements. Further, in a similar paper titled "THz and Mid-IR Quantum cascade lasers" Faist includes a section on broadband tuning (at page 13). This is accomplished via an external cavity arrangement. Faist additionally leads a research group at the Institute of Physics in Neuchatel, Switzerland which published a paper: "Broadly tunable external cavity quantum-cascade lasers" where bound-to-continuum structures suitable for broadband use are mentioned.

"Recent updates in QCL-based sensing applications" is the title of a paper by Joel Hensley from Physical Sciences Inc., of Andover, Mass. where discussion regarding an enhanced tuning range of QCL lasers is mentioned. The same Hensley further describes QCL systems in a paper titled "Demonstration of an External Cavity Terahertz Quantum Cascade Laser"—published by the Optical Society of America, 2005.

Inventors Pham et al teach in U.S. Pat. No. 7,061,022 published Jun. 13, 2006, special laterally disposed heat spreading layers for epi-side up semiconductor lasers. While suggesting excellent heat management technique, the presentation clearly promotes epi side up as the best arrangement.

A laser diode is presented in an epi-down mounted configuration by Yamabayashi et al in U.S. Pat. No. 6,575,641 published Jun. 10, 2003. The laser enjoys a good thermal contact with a bulk base substrate operable for extracting to heat from the laser thus improving its performance.

U.S. Pat. No. 5,082,799 presented by inventors a Holmstrum et al., entitled "Method for fabricating indium phosphide/indium gallium arsenide phosphide buried heterostructure semiconductor lasers" These systems include semiconductor lasers arranged in an epi-down configuration. Moreover, these systems are presented in view of improving tuning range. The author notes a bandwidth of 24 GHz and has been observed.

Stephane Blaser presents a summary on QCL systems including those room temperature systems mounted in an epi-side down configuration. The presentation was made as: "Photonics West 2006—Novel In-Plane Semiconductor, Lasers V: Quantum Cascade Lasers: 6133-01" Room temperature QCLs were first realized partly due to the improved heat extraction afford by epi-down mounted configurations.

Another practitioner group from the INFM-University of Bari in Italy similarly presents a discussion on using QCLs in an epi-down mounted configuration. Their paper titled: "Micro-probe characterization of QCLs correlation with optical performance". A comparison is made between similar devices in epi-up and epi-down configurations; the comparison indicates heat extraction advantages.

Corrie Farmer's PhD thesis: "Fabrication and Evaluation of —$In_{0.52}Al_{0.48}As/In_{0.53}Ga_{0.47}As/InP$—Quantum Cascade Lasers"; University of Glasgow; September 2000, documents some analysis he has performed on QCL devices including experimentations on epi-up and epi down mounted lasers. Mr. Farmer has mounted a QCL structure epi-down directly onto a copper heat sink to achieve high performance heat transfer.

"Improved performance of quantum cascade lasers through a scalable, manufacturable epitaxial-side-down mounting process" is the title of a paper supported by DARPA contract HR0011-C-0102, which shows exceptional comparisons between epi-up mounted and epi-down mounted QCL systems in a Proceedings of the National Academy of Sciences publication dated March 2006. A second similar publication in the Proceedings of the National Academy of Sciences dated July 2006 is directed to sub-parts-per-billion detection of $NO_2$ using room temperature QCLs. These systems include continuously tunable external cavity QCLs.

SUMMARY

Embodiments disclosed herein relate to systems that provide tunable mid-IR optical sources. Very wide gain bandwidth devices may be realized by combining advanced heat extraction structures and configurations with a miniature tunable external cavity. In particular, a quantum well semiconductor arranged in an epi-down mounting configuration may be used as the gain medium of an external cavity quantum cascade laser ECQCL system; the cavity characterized as a 'short' cavity less than about 30 millimeters. The epi-down mounting facilitates heat removal and results in a reduction of cavity losses or a lowering of a "loss line" associated with the resonator/laser system. As a laser gain profile is sometimes approximated as Lorentzian in shape, a lowered loss line permits a greater wavelength tuning range as those wavelengths at the extremities of the gain curve become viable lasing wavelengths where gain begins to exceed loss.

A unipolar quantum well stack is grown in an epitaxial process. Thin-layer by thin-layer, a crystal is deposited or "grown" onto a substrate having a matched crystalline structure. This substrate not only provides a crystal 'seed' or crystal base for the subsequent layers, but additionally provides a mechanical platform for the device. However, the base can be a liability during operation. In most configurations of QCLs in the art, a quantum well gain medium is mounted with an "epi-up" arrangement. In this fashion, heat generated in the active region must pass through the crystal base before leaving the device to a heatsink. Accordingly, the base is part of heat circuit for epi-up mounted systems. Unfortunately, in such configurations it operates as a heat insulator between the heat source and heat sink. While a moderate heat conductor, it is far less efficient than other heat conductors. As such, in an epi-up configuration the base can significantly hinder heat removal from the active region. This presents further difficulty in systems of reduced size as large temperature gradients can result. Large temperature gradients tend to result in misalignment of system components due to thermal expansion. Accordingly, as compact systems are especially vulnerable to problems related to heat, these systems get special benefit where improved thermal management results in elimination of severe temperature gradients. In tunable external cavity systems of highest performance, a high numerical aperture short focal length lens is included intracavity. Because the lens is sometimes arranged less than one millimeter from an emission surface of the gain medium, a large temperature gradient can present alignment difficulties. To protect these special lenses from such problems, it is highly desirable to reduce or eliminate the large temperature gradients.

"Epi-down" mounted systems as disclosed here are particularly configured to exclude the base from the heat transmission path. When an epi side of the device is directly bonded to a heat transport body or thermally conductive substrate, heat passes more readily to the heatsink as it does not first have to traverse the base. With effective heat transfer as described, these devices may remain cooler for a nominal operating current. System losses are dependent upon operating temperature, and losses are reduced in devices operating at lower temperature. When plotted in conjunction with a laser gain curve which is wavelength dependent, these losses are represented by a 'loss line.' Careful examination of a gain curve/loss line plot reveals an improved tuning range.

Quantum cascade lasers QCLs have only recently been arranged as highly tunable systems. Tunability has previously been highly restricted to a "freeze or fry" strategy where extreme temperature variances produced very slight wavelength shifts. However, now unipolar quantum well lasers are being realized with great tunability performance as they are being arranged in conjunction with external cavity systems. External cavity arrangements of QCLs enable very wideband tuning. Indeed many orders of magnitude improvement of tuning range are available via these configurations.

Embodiments may combine the advantages of epi-down mounted quantum well gain medium configurations with specialized compact external cavity optical resonators to further improve tuning range. Epi-down mounted systems combined with the dynamic tuning afforded by external cavity configurations may provide highly tunable, high performance mid-IR optical sources.

BRIEF DESCRIPTION OF THE DRAWING FIGURES

These and other features, aspects, and advantages will become better understood with regard to the following description, appended claims and drawings where:

Figure 9:
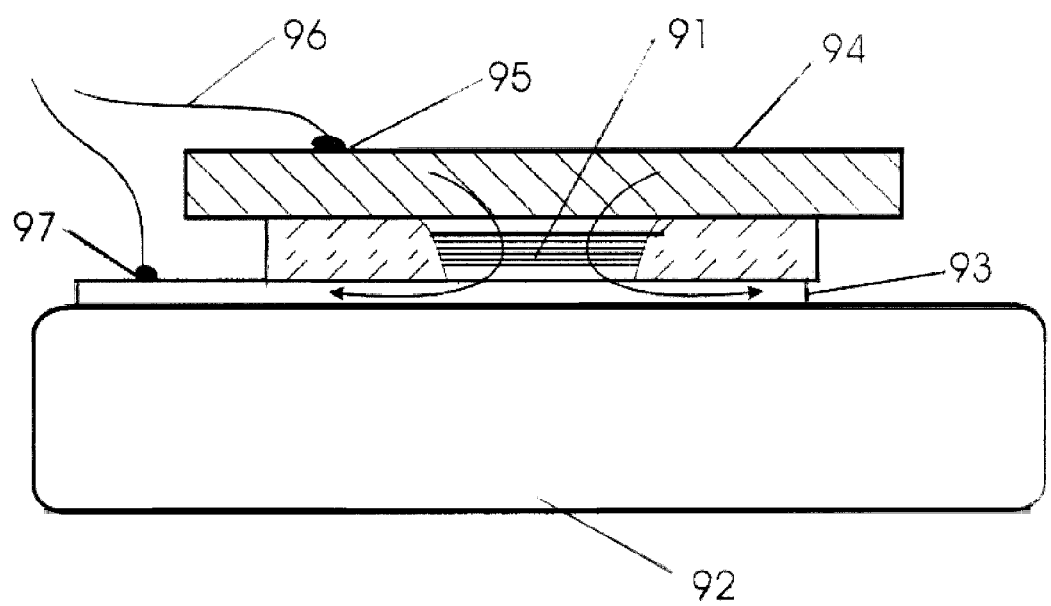
Figure 10A:
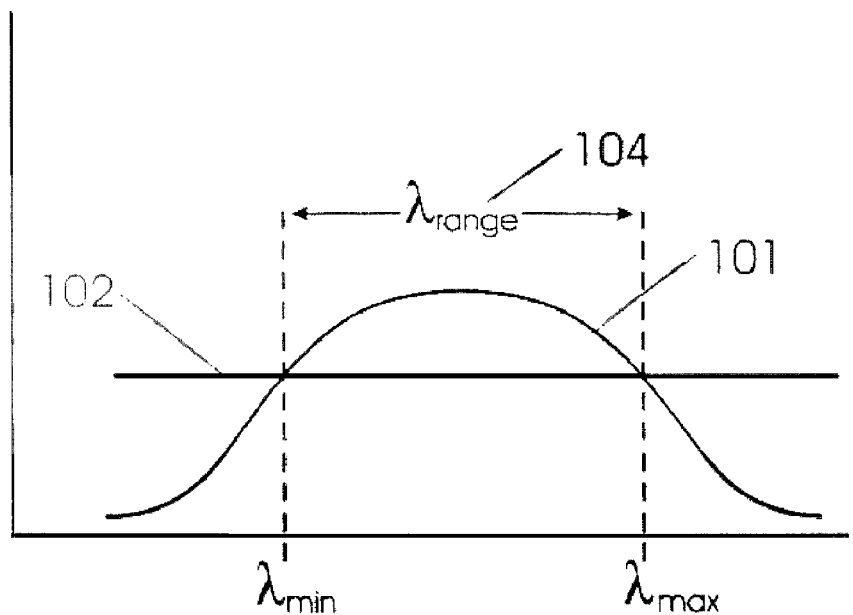
Figure 10B:
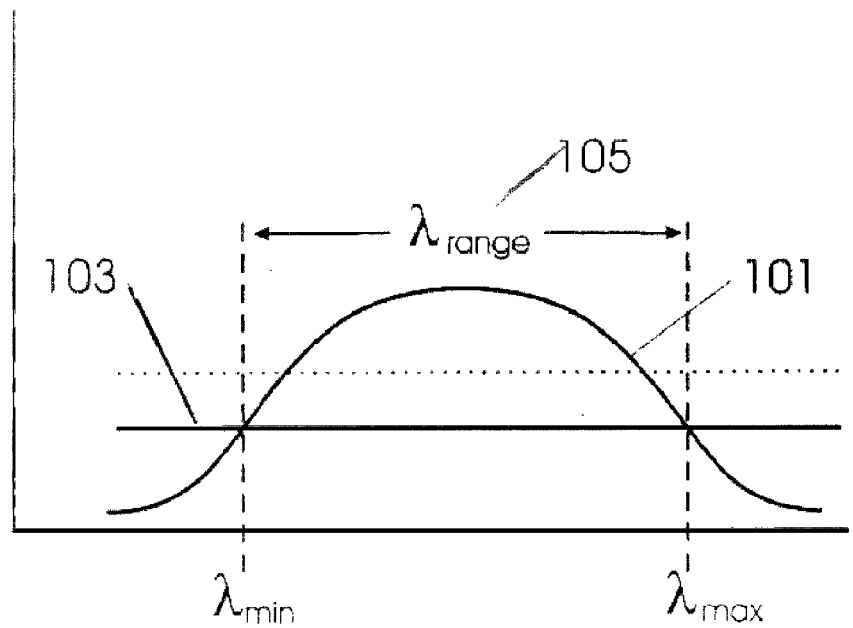

FIG. 9 presents an example of wire bond connections which may be used to energize these systems; and FIGS. 10A and 10B are graphical illustrations of an example laser gain curve superimposed with an optical cavity loss line in a 'before and after' presentation.

DETAILED DESCRIPTION

Throughout this disclosure, reference is made to some terms which may or may not be exactly defined in popular dictionaries as they are defined here. To provide a more precise disclosure, the following terms are presented with a view to clarity so that the true breadth and scope may be more readily appreciated. Although every attempt is made to be precise and thorough, it is a necessary condition that not all meanings associated with each term can be completely set forth. Accordingly, each term is intended to also include its common meaning which may be derived from general usage within the pertinent arts or by dictionary meaning. Where the presented definition is in conflict with a dictionary or arts definition, one must consider context of use and provide liberal discretion to arrive at an intended meaning. One will be well advised to error on the side of attaching broader meanings to terms used in order to fully appreciate the entire depth of the teaching and to understand all intended variations.

Quantum Cascade Laser. A quantum cascade laser is a semiconductor base optical source comprising eight optical resonator cavity coupled to a gain medium, the gain medium including a plurality of quantum well structures each separated from others by barrier regions.

Quantum Well Stack. A quantum well stack is a semiconductor structure having a plurality of thin layers of highly regulated thickness. These thin layers define quantum well and barrier systems which support particular electron energy states and energy state transitions in accordance with a particular design. By careful selection of these energy state transitions, a quantum well stack may be fashioned and operate as the core of a laser gain medium. When a quantum well stack semiconductor is combined with a suitable optical resonator system and energizing or 'pumping' system, a device which supports stimulated emission or lasing action is achieved. For this paragraph, 'thin' means on the order of the de Broglie wavelength of an associated electron.

Unipolar Quantum Well Gain Medium. A unipolar quantum well gain medium is a system of elements including pump mechanism, waveguide system, unipolar quantum well stack, emission facets, and a base substrate, which operate together to provide optical amplification by stimulated emission. For purposes of this disclosure, a unipolar quantum well gain medium is distinct from a laser in that it does not include an optical resonator gain media described herein are always unipolar. That is, gain media are comprised of semiconductor materials of a declared semiconductor type either 'P' or 'N'.

Thus, unipolar devices are certainly distinct from diodes which include both N-type and P-type and particularly a junction between. Conversely, unipolar systems are comprised of exclusively one semiconductor type.

Wavelength Select Element. A wavelength to select element is any optical element which couples light of a particular wavelength band to an external system to the exclusion of other wavelength; i.e. wavelengths outside the band are decoupled from the external system.

In accordance with preferred embodiments, wideband mid-IR tunable external cavity unipolar quantum well lasers based upon epi-down mounted gain media are provided. It will be appreciated that each of embodiments described includes an apparatus and that the apparatus of one preferred embodiment may be different than the apparatus of another embodiment.

As indicated, an external cavity unipolar quantum well laser may be configured to be tunable over an extremely wide wavelength band. Quantum well lasers configured in an external cavity arrangement, permits integration of a wavelength select element such as a grating or prism. The grating or prism restricts laser oscillation to wavelengths of a selected wavelength band which are fed back to the resonator cavity by the grating or prism. Quantum well lasers have only recently been coupled to such wavelength tunable mechanisms.

One of the primary reasons why a quantum well laser is particularly attractive for use in wideband tunable systems is there exists great control over design of a gain curve associated with quantum well gain media. Unlike semiconductor diode's which realize optical gain from bandgap properties of their PN junctions, quantum well gain media realize gain from energy transitions associated with an electron passing from one quantum well to another. The nature of the wells are adjustable by manipulation of layer thickness rather than material content. As such, a quantum well based gain medium can be configured to support many transitions of various energy. In addition, a quantum well gain medium can have present in a single device, many hundreds of such quantum wells supporting many hundreds of distinct transitions. In this way, quantum well gain media-support simultaneous oscillation on many wavelengths. Sometimes this is expressed mathematically or diagramed as a 'gain curve'. A plot of gain versus wavelength to suggest the gain bandwidth associated with any particular laser gain device.

Experts in laser sciences will recall plots of gain bandwidth superimposed with a "loss line" associated with a particular optical cavity system. The intersections of a gain curve and loss line define a system tunability range. A minimum wavelength and maximum wavelength are implied by these intersections. Mechanisms which move the loss line either up (more losses) or down (less losses) therefore have an effect on the minimum and maximum wavelength addressable and thus the overall tuning range. Accordingly, it becomes highly desirable when trying to make wideband tunable quantum well lasers to lower the system loss line in a manner which extends tunability.

One important way to lower a loss line is to reduce operating temperature. As a device heats up, losses increase and laser performance is compromised. Conversely, a well cooled device enjoys less exposure to loss mechanisms. If one applies advanced heat extraction mechanisms to the quantum well gain medium, it becomes possible to lower the associated loss line and realize lasing over an extended wavelength range.

A most important technique for efficiently extracting heat from a quantum well gain medium includes providing a good thermal coupling between the active region and a highly conductive body. The 'active region' of a quantum well gain medium is the epitaxially grown quantum well stack. A body of high thermal conductivity may merely be a slab of bulk material such as a metal. Copper is a particularly suitable metal and some alloys of copper are also quite sufficient In very high performance versions, a slab of diamond may be used as diamond is most effective for heat transfer. Heat generated at a semiconductor may quickly pass into the thermally conductive body and further to an appropriate heatsink. So long as the heat source is in close proximity to the body of high thermal conductivity, heat transfer can be made efficient.

In some cases, it is desirable to form a heat, transfer system in two parts including a bulk substrate portion and a carrier substrate portion thermally coupled to each other. The bulk substrate portion having first thermal conductivity value of about 100 W/mK, and the carrier substrate portion formed of material having thermal conductivity greater than about 500 W/mK. The carrier or 'submount' being substantially smaller than the bulk substrate portion, permits low manufacturing cost while still providing excellent heat removal functionality. In the case where a diamond submount is used, a thermal conductivity may be achieved as high as 2000 W/mK.

As part of the gain medium fabrication process includes an epitaxial step where layers are deposited onto a base crystal, these gain medium systems necessarily include a base side and an 'epi-side'. It has been heretofore quite convenient to bond and affix the base side of a quantum well gain medium to coupled external systems including mechanical, thermal, and electrical systems. This is partly due to the increased mechanical stability offered by the base side. Indeed, in nearly all cases one might find in the art this is the arrangement provided as there are considerable assembly advantages in these configurations. The art solidly teaches epi side up mounting as being the advantaged configuration.

In contrast to the teachings of the art, it is now possible and indeed highly desirable to bond a quantum well gain medium 'upside down' with respect to the art; that is, in an 'epi-side' bond or epi-side down bond.

An epi side down bond puts the active region closer to the thermal extraction means and takes the base crystal out of the thermal circuit. Because the active region is so close to the thermal transport system, it more effectively carries heat away from the device. For a given operating current, the device temperature will be lower. In agreement, system losses will be reduced and lasing will become possible on wavelengths not otherwise reachable.

Figure 1:
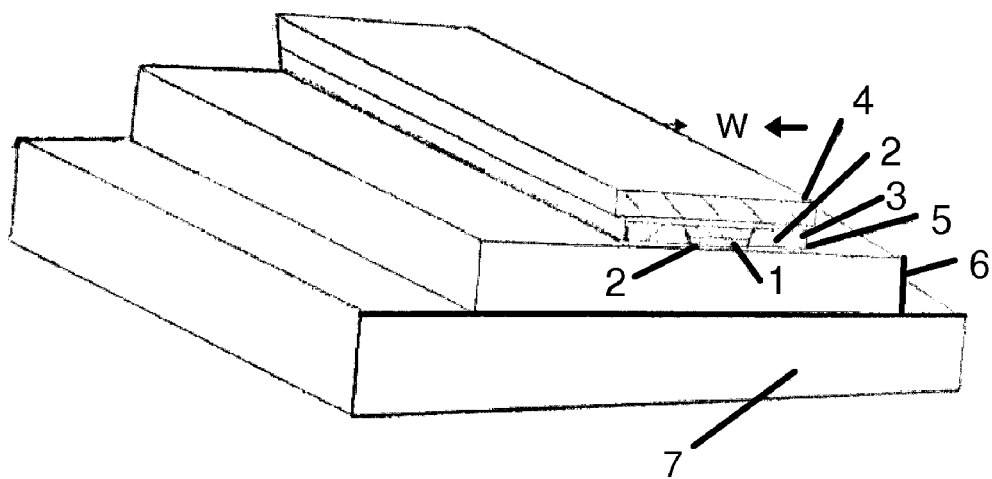
FIG. 1 illustrates a cross section perspective of a gain medium device and its mounting arrangement.

Accordingly, a wavelength tunability range is improved by combining an epi side down mounting configuration in an external cavity quantum well based laser. This is more readily understood in consideration of some important examples detailed and described here in conjunction with drawing figures and associated reference numerals therein. In particular, FIG. 1 illustrates a cross-sectional perspective view of an epi-down mounted quantum well gain medium. A quantum well stack 1, of multiple semiconductor layers having width W lies between waveguide layers 2, and similarly between regrowth material 3. These elements together are formed in crystal growing processes and together form the 'epi' side of the device. The base 4, is a crystal slab which provides a seed starting point and mechanical support for the epitaxial process this portion of the device is called the 'base side'.

The device is bonded via bond layer 5, to a substrate of high thermal conductivity 6. The bond may be formed via adhesive materials but is preferably achieved as a weld or solder bond where a metallic material is fused or otherwise intimately connected to the top layer of the quantum well gain medium. Sometimes it is necessary to use special solders or alloys and highly specialized process to achieve good connections with the crystal material, and those materials bond processes are anticipated here however for the purposes of this example it is sufficient to say an electrically and thermally sound bond is formed between the epi-side of the quantum well gain medium and a body of high thermal conductivity. Finally, the system may be joined with a heat sink 7, having great ability to dissipate or otherwise store or transfer heat. A quantum well gain medium arranged in this fashion will operate at much cooler temperatures in comparison to epi-up mounted devices which necessarily have the base side disposed between the active region and heatsink.

Figure 2:
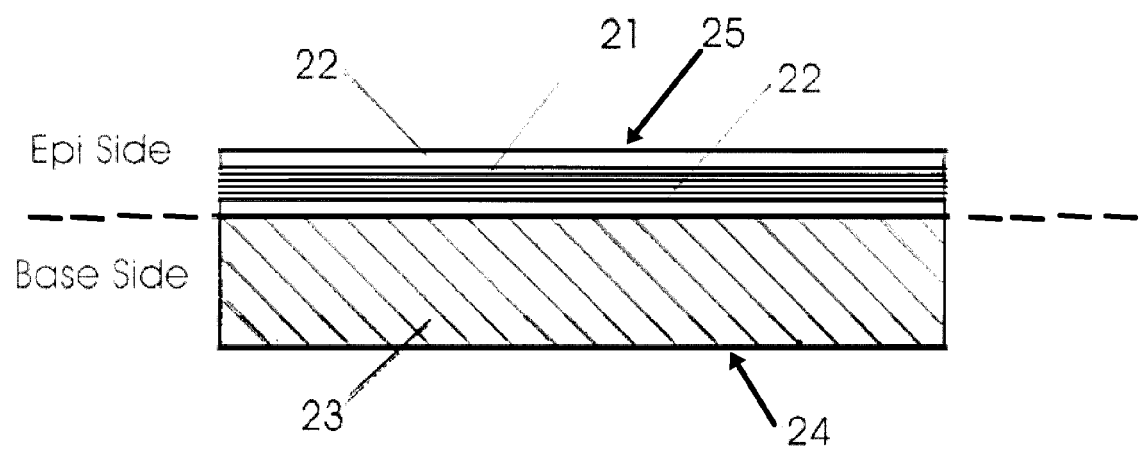
FIG. 2 is an example of quantum well stack multi-layer structure of these embodiments in a most basic configuration.
Figure 3:
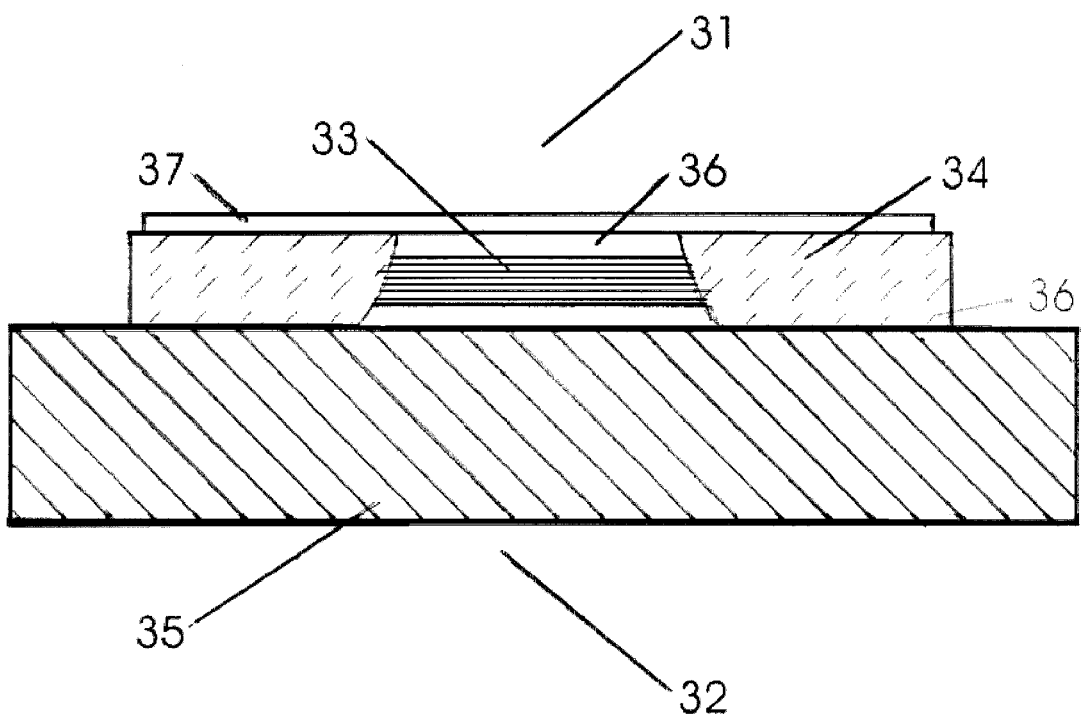
FIG. 3 is another cross sectional diagram of the same semiconductor structure in a further advanced or processed state.

While FIG. 1 is directed to the very important construction herein known as epi-down bond, for a full understanding it is important to more clearly define nomenclature of the quantum well stack (illustrated in FIG. 2) and quantum well gain medium (illustrated in FIG. 3). FIG. 2 is a cross section drawing which depicts an epitaxy structure on a base substrate. A stack of great plurality of layers 21 forms a multiple quantum well arrangement in accordance with a prescribed laser design. Various layer thicknesses and numbers of layers will provide desired laser performance characteristics. The quantum well layer stack lies between two relatively thick layers 22 which operate as a waveguide or cladding system. Because the overall thickness of the quantum well stack is quite thin in comparison to the space needed to support propagation of a mid-IR light beam, it is useful to 'thicken' the system in this dimension and this is taken up as a waveguide portion. The waveguide layers are optically transparent or conductive and also support electrical conduction. While they are moderately conductive thermally, it is a necessary condition that they do not transfer heat as well as might otherwise be desired. A basic crystal slab 23, is the foundation and starting point upon which the epi layers are deposited. The slab is crystal matched with respect to the structure of the crystal material chosen for the epi layers. Accordingly, it is herein said that the device has a base side 24, which merely includes the base crystal, and an epi-side 25 which includes all at the epi layers described.

FIG. 3 is a similar cross-sectional drawing which illustrates the device after additional processing. The epi side 31, is considerably modified while base side 32, remains without change. The active region 33, is formed when the quantum well stack layers are reduced to a narrow stripe of a few tens of microns wide and more than one millimeter in length. In an etching process, epi material is removed in a spatial pattern to form the stripe. After a stripe is formed, a special process replaces the removed material with a 'regrowth' material 34. The regrowth material fills in space where layered material was removed. This material is preferably arranged as an electrical insulator and good thermal conductor. Such structure forces electrical current to pass through the quantum well stack thus stimulating the gain medium. The regrowth structure also helps to further shape a resonating beam as it forms a junction of different refraction indices promoting internal reflection. Finally, and quite importantly, the regrowth material is a moderate heat conductor and helps couple heat from the active region to the base 35, or other surrounding structures. Waveguide layers 36, may be on either side of the quantum well stack and provide optical support for lasing modes as they extend the device thickness. Finally, a top layer may be arranged as an electrical contact 37 and may be also arranged to support bonding. The layer may be formed of a material which is electrically and thermally conductive. It may be prepared as a solder material having a low melting temperature such that it can be used to bond the device to an external system; for example, a body having a high-thermal conductivity.

Figure 4:
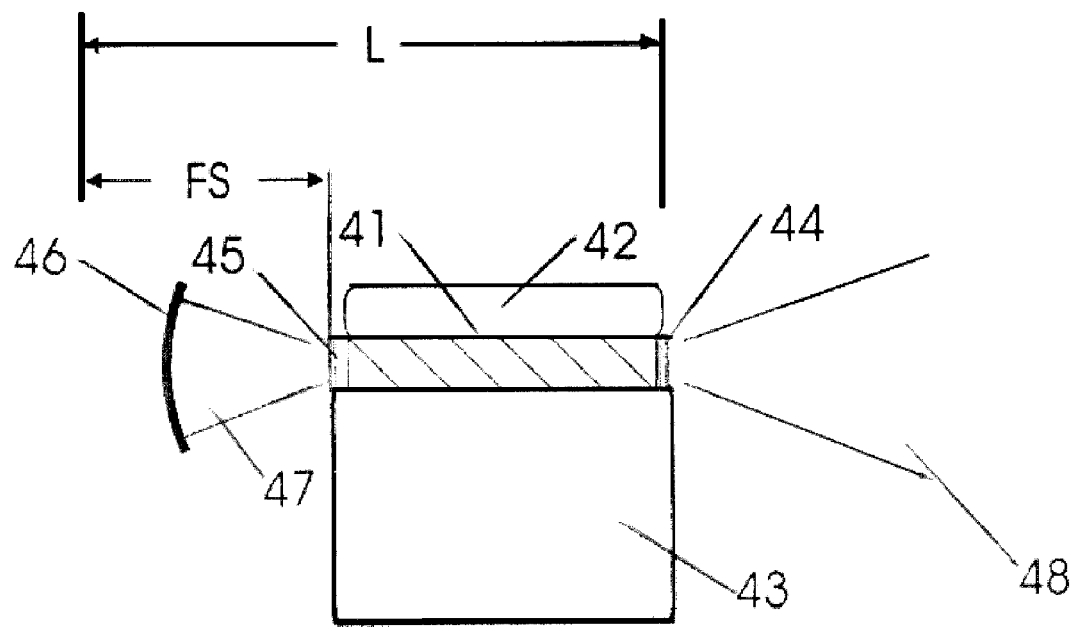
FIG. 4 illustrates an external cavity quantum well laser in combination with an epi-down mounted quantum well stack.

A first preferred embodiment yields an epi-down mounted quantum well laser having an external cavity illustrated in FIG. 4. A semiconductor structure arranged as a quantum well stack 41, is epitaxially grown onto base substrate 42. The epi side is bonded to thermally conductive body 43, via a solder connection. An end mirror 44 is an HR high reflector thin-film mirror which forms a first end of a resonator cavity. Anti-reflection coating 45, couples light from the gain medium into a free space FS portion of the resonator (and vice versa). Cavity mirror 46, completes the resonator cavity and provides feedback beam 47, to the amplification stage. A laser output beam 48, is that which passes the end mirror formed on the gain medium. FIG. 4 illustrates the most basic version of an epi-down mounted laser with a cavity having a free space portion.

Figure 5:
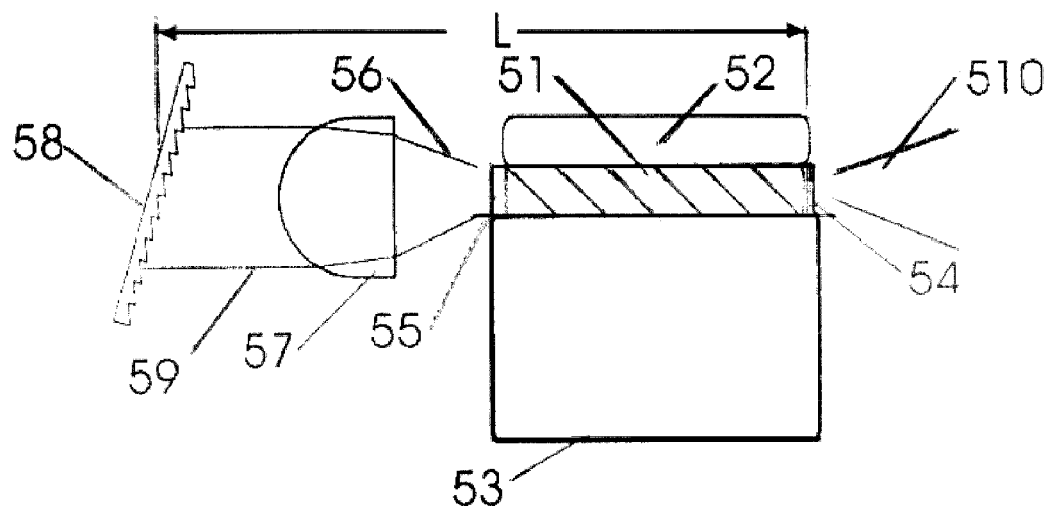
FIG. 5 is a diagram which depicts a laser system with a static wavelength select element.
Figure 6:
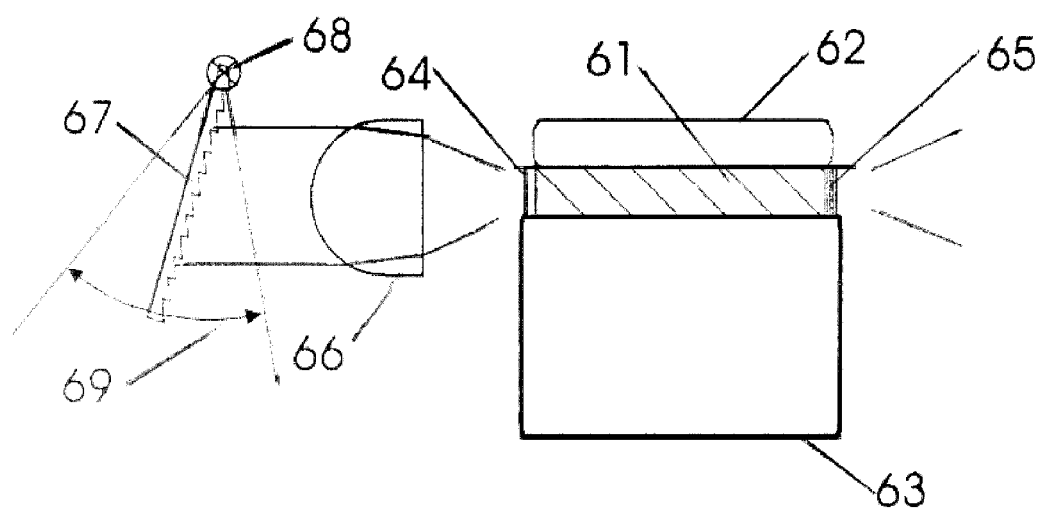
FIG. 6 is a system cross section illustrating a tuning element or dynamic wavelength selection element.

FIG. 5 illustrates another important example quantum well laser system which includes additional elements in a preferred arrangement. In particular, a laser system is formed of a gain medium within an optical resonator cavity having a free space portion arranged in a wavelength tunable configuration. The gain medium 51 includes a quantum well stack semiconductor crystal layers of various thickness grown in an epitaxially process on a semiconductor substrate 52.

After a quantum well stack has been grown on the semiconductor substrate, the system, essentially a single crystal, may be coupled to other subsystems. A first important coupling includes one having consideration for thermal transfer. During normal operation of these laser systems, great heat is generated in the gain medium and it becomes desirable to efficiently remove that heat. Accordingly, very close and thermally efficient coupling between a heat spreading submount element 53 and the heat generating gain medium is provided when the epi side is bound directly to the submount. In most conventional systems, the substrate side is bound to additional supporting or mounting devices. In contrast these systems rely upon an epi-down configuration where the quantum well stack is coupled to the submount having a high capacity to transfer heat from the gain medium to the heat sink. In preferred arrangements, these gain media are coupled to the resonator on two opposing facets. These facets may be formed in a cleaving process where the crystal is cut along one of the natural planes inherent in the crystal structure. Such cleaved facets serve to couple light into and out of the gain medium.

Emission facet 54, is arranged as a high reflector mirror. The other end facet is prepared with an anti-reflection coating 55, such that light beams easily pass to and from the gain medium. Highly divergent free space beam 56, is collimated by special in-cavity collimation lens 57, into a beam of planar wavefronts. Plane waves are incident on wavelength select element grating 58 arranged to feed back light of a particular wavelength band in a return beam to the cavity. In this way, the laser is forced to oscillate only on those wavelengths dictated by the specific arrangement of the grating. The laser output 510, is narrowband or 'single wavelength' in these arrangements. While it is convenient to use a grating in some systems, it is anticipated that other optical elements may serve equally well or provide additional advantage. Thus various embodiments may include wavelength select elements from the group including: acousto-optic light modulator; electro-optic light modulator; a grid; a thin-film filter; a prism; a grating; a holographic optical element; kinoform; binary optical element; a Fabry-Perot system arranged as a wavelength filter; and a Fresnel surface relief optical element.

Either of these might be used to provide wavelength specific feedback to the gain medium and each are considered viable alternatives.

Similar preferred versions are comprised of dynamically tuned lasers. As with the previous example, an epi-down mounted quantum well gain medium is coupled with an external cavity type optical resonator having a free space portion in which a dynamic wavelength selection function is taken up. The epi side 61, of a gain medium, including base side 62, is bonded epi-down to highly conductive (heat) body 63. Anti-reflection coating 64 and end mirror 65 are the emission facets of the gain medium. In-cavity collimation lens 66 is placed with the focus at the emission facet to collimate light from the gain medium and couple, it to the wavelength select element 67, a blazed grating. In this case, the grating is mounted on a pivot axes 68 such that its angle with respect to the input beam may be adjusted over a range of angles 69. Each angle will correspond to a different wavelength which is returned precisely down the system axis thus forcing the laser to operate on a single "line".

Figure 7:
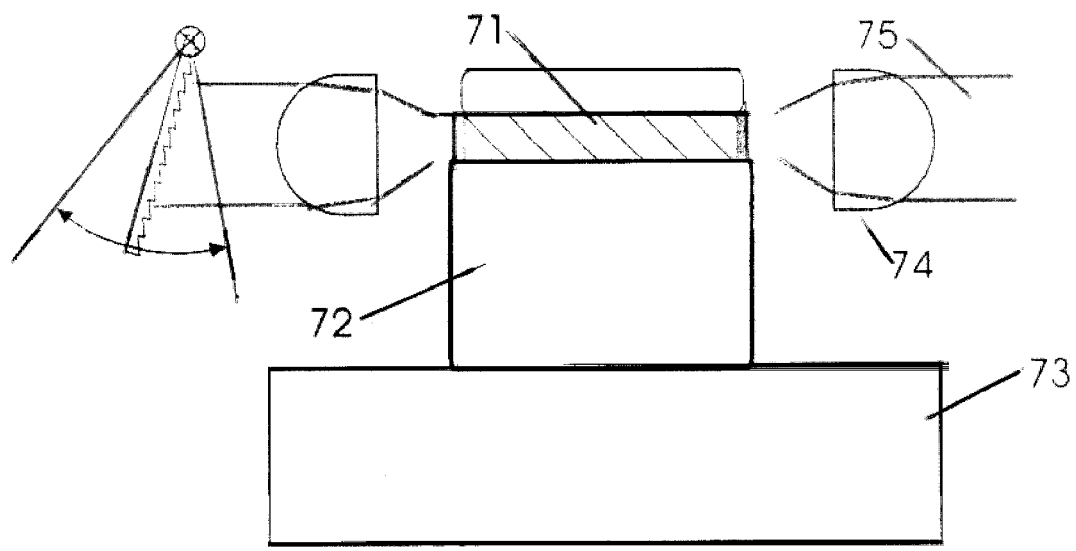
FIG. 7 illustrates a system with auxiliary elements including an output coupler and heatsink.

FIG. 7 further illustrates some important system components. Epi-down mounted gain medium 71, is bonded to heat spreader substrate 72, and combined with a wavelength tunable external cavity to form a wideband tunable laser. Heat spreader 72, is further coupled to heatsink 73. A heat sink may be arranged to merely radiate heat away from the system. Conduction/convection type heat sinks having "cooling fins" are anticipated. High performance systems may deploy active cooling means such as liquid cooled systems or thermal electric coolers. In either of these cases, a heat spreader system is coupled to means of disposing heat—i.e. various forms of heatsink systems. In addition, an output lens 74 is provided at the system exit aperture to provide a final collimated laser output beam 75.

Figure 8:
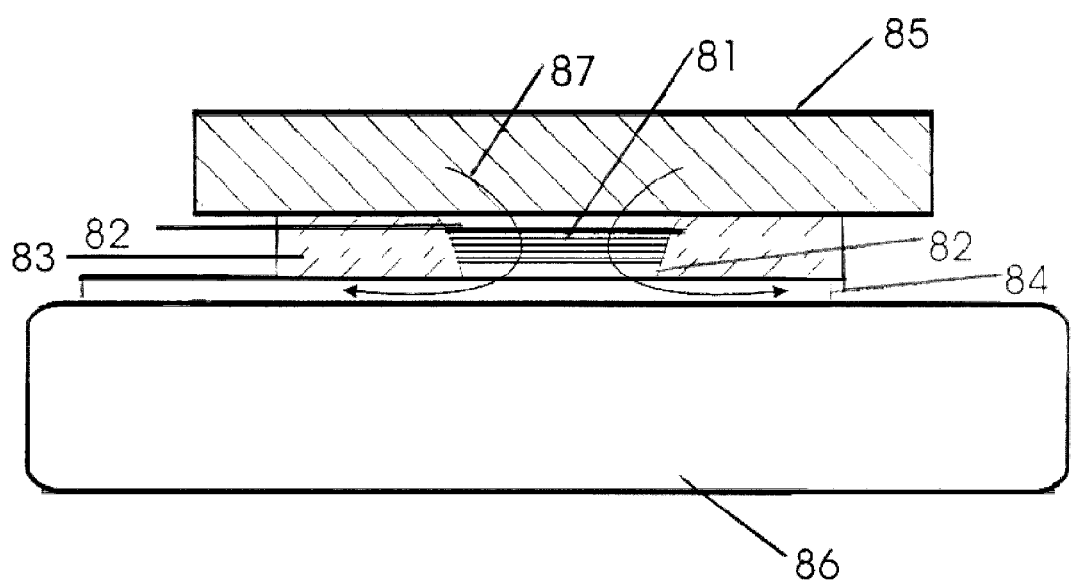
FIG. 8 is a current flow illustration to show cooperation between a bond and electrical arrangements of the systems.

The epi-down configuration has important implications with regard to the electrical connections necessary to energize the device. It is convenient to provide the bond as an electrical conductor. This is particularly important in systems where the heat spreader element is an electrically insulative diamond. FIG. 8 illustrates an electrical current path of preferred versions. Quantum well stack 81, is sandwiched between electrically conductive waveguide layers 82. Electrically insulative regrowth material 83 is solder bonded via metallic layer 84. Base substrate 85, is electrically conductive and supports electrical current therethrough. Diamond submount or other heat spreader is arranged as a body 86 having high thermal conductivity. In this arrangement, a serial electronic circuit includes: the base substrate, waveguide layers, the quantum well stack, and the bond layer.

When an electrically insulative heat spreader is used, it becomes necessary to provide for an electrical lead to the bond layer which may not be readily accessible with respect to common wire bond type connections. As such, a diamond submount may be prepared with a circuit trace lead which extends from the epi-down bond layer on the surface of the submount to form a wire bond pad where a suitable connection may be supported.

FIG. 9 illustrates a quantum well gain medium 91, in an epi-down configuration bonded to diamond heat spreading body 92, at electrically conductive metallic bond layer 93. Base substrate 94, is provided with wire bond pad 95, to which a wire electrical conductor 96, may be affixed in a conventional wire bond connection. Bond layer 93, is extended on the surface of the submount and also is provided with similar wire bond pad 97. As such, the epi-down bonded quantum well gain medium can be connected to an energizing source despite loss of direct access to the top epi layer.

FIGS. 10A and 10B illustrate wavelength tuning ranges associated with a lowering "loss line". General laser theory suggests a gain curve to describe a population inversion profile of energy state transitions. While it is fully appreciated here that the gain profile associated with quantum well stack structures is highly tunable and does not necessarily approximate the more common Lorentzian shape associated with gas lasers, it nevertheless exhibits a non-discrete or continuous transitions from maximum population inversion to minimum population inversion. For convenience we use the simplified gain curve of FIG. 10, at the same time recognizing that the true gain curve of a quantum cascade laser is adjustable via the structure dimensions. Generality is not lost in taking this approximation.

With particular regard to FIG. 10A, one will appreciate that to illustrate allowed wavelengths of a laser system, a loss line may be plotted along with a gain curve. The loss line represents the sum of all losses in a laser cavity and is generally, but not always, the same for all wavelengths. The loss line plots of FIG. 10 assume wavelength independent losses and therefore the line is drawn flat across the graph.

FIG. 10B represents an improved system where losses have been reduced by way of a system operating at a reduced temperature; for example, a device operating in an epi-down mounted configuration. Accordingly, the loss line is drawn at a lower level to reflect that. When the loss line is lowered as described, a greater lasing wavelength-range is realized as more of the extremities of the gain curve lie above the losses; i.e. the condition for lasing.

The examples above are directed to specific embodiments which illustrate preferred versions of devices and methods. In the interests of completeness, a more general description of devices and the elements of which they are comprised is presented herefollowing.

In accordance with the description provided, embodiments may include optical sources formed of a quantum well gain medium; a thermally conductive substrate; and an optical resonator, where the gain medium has a base side and an epi side, and the epi side is bonded to the thermally conductive substrate, and the optical resonator includes a free space portion or an optical feedback element spatially removed from the gain medium.

Further, the quantum well gain medium bonded to thermally conductive substrate may form a serial circuit whereby electrical current passes from the base side, through quantum wells, and into a bond layer.

The quantum well gain medium typically includes a quantum well stack, waveguide layers, regrowth material, emission facets, and a bond layer.

The waveguide layers are on typically on both sides of the quantum well stack and are optically and electrically conductive.

The regrowth material is electrically insulative, optically opaque, and disposed on either of two opposing sides of the quantum well stack, the emission facets are planar surfaces formed in a natural plane of the crystal operable for coupling of optical beams into and out of the gain medium. The bond layer is a metallic or electrically conductive layer disposed on a waveguide layer to form a bond between the epi side of the quantum well gain medium and the thermally conductive substrate.

The devices further have bonding pads in electrical contact with: 1) the bond layer a suitable for wire bond attachments, and 2) the base side of the quantum well gain medium. The bonding pads are arranged to support wire bond connections, said wire bond connections being suitable for high pulsed current applications.

Devices may have an anti-reflection prepared facet coupled to the optical feedback element via a lens having a short focal length and high numerical aperture. Such lens is arranged between the prepared facet and the optical feedback element the lens planar side towards the prepared facet and the lens convex side toward the feedback element such that substantially collimated light falls incident upon the feedback element.

A feedback element is sometimes a wavelength select element which feeds back a selected wavelength band and discriminates against all other wavelengths by decoupling them from the resonator.

A wavelength select element is static when they are mounted in a fixed position and are dynamic when made adjustable for changing the wavelength.

A wavelength select element is a dynamic or tunable wavelength select element whereby the wavelength fed back to the gain medium is changeable. For example, a wavelength select element may be a grating mounted on a pivot axis. A grating may be coupled to an electromechanical actuator arranged to move the grating about the pivot axis in response to an applied electronic signal.

In some versions, a thermally conductive substrate may be formed of two parts: a bulk substrate portion and a submount portion thermally coupled to each other. The bulk substrate portion typically has a thermal conductivity greater than about 100 W/mK, and the submount portion is typically formed of material having a thermal conductivity greater than about 500 W/mK and being substantially smaller than the bulk substrate portion.

One will now fully appreciate how epi-down mounted quantum well gain media provide special cooperation with wavelength tunable external cavity lasers. Although the present embodiments have been described in considerable detail with clear and concise language and with reference to certain preferred versions thereof including best modes anticipated by the inventors, other versions are possible. Therefore, the spirit and scope of the invention should not be limited by the description of the preferred versions contained therein, but rather by the claims appended hereto.

What is claimed is:

1. A source comprising:
   a thermally conductive substrate;
   a quantum well gain medium that is directly bonded to the thermally conductive substrate, the gain medium having a base side and an epi side, the gain medium further comprising a quantum well stack, waveguide layers, and a bond layer; wherein the quantum well stack is comprised of a plurality of semiconductor layers forming quantum wells and barrier regions; wherein the waveguide layers are disposed on the epi side and the base side of the quantum well stack and are optically and electrically conductive; and wherein the bond layer is a metallic or electrically conductive layer disposed on one of the waveguide layers to form a bond between the gain medium and the thermally conductive substrate; and
   an optical resonator having at least one optical feedback element spatially removed from the gain medium.

2. The source of claim 1 wherein the gain medium includes a pair of opposed sides that extend between the base side and the epi side, and wherein the gain medium includes a regrowth material that is an electrical insulator, the regrowth material being disposed on at least one of the opposing sides of the gain medium.

3. The source of claim 1 wherein the gain medium includes emission facets that are planar surfaces formed in a natural plane of the quantum well stack operable for coupling of optical beams into and out of the gain medium.

4. The source of claim 1 wherein the epi side is directly bonded to the thermally conductive substrate.

5. The source of claim 1 wherein the optical feedback element includes two opposing elements arranged to couple a feedback optical beam back into the quantum well gain medium from which an amplified beam arises thus forming an optical resonant cavity, and wherein the two opposing elements are separated by no more than about 30 millimeters.

6. The source of claim 1 wherein the thermally conductive substrate includes a carrier substrate portion that is formed of material having a thermal conductivity of greater than about 500 W/mK.

7. The source of claim 6 wherein the thermally conductive substrate including a bulk substrate portion that is formed of material having a thermal conductivity of greater than about 100 W/mK.

8. The source of claim 1 wherein the thermally conductive substrate has a thermal conductivity of greater than about 200 W/mK.

9. The source of claim 1 wherein the thermally conductive substrate has a thermal conductivity of between about 1500 and 2000 W/mK.

10. The source of claim 1 wherein the thermally conductive substrate includes copper.

11. The source of claim 1 further comprising a lens positioned between the feedback element and the gain medium, the lens having a short focal length and a high numerical aperture.

12. A source comprising:
    a quantum well gain medium having a base side and an epi side;
    a thermally conductive substrate that is bonded to one of the sides of the gain medium, the thermally conductive substrate including a carrier substrate portion that is formed of material having a thermal conductivity of greater than about 500 W/mK; and
    an optical resonator that is less than 30 millimeters in length and comprises at least one optical feedback element spatially removed from the quantum well gain medium.

13. The source of claim 12 wherein the epi side is directly bonded to the thermally conductive substrate.

14. The source of claim 12 wherein said optical feedback element includes two opposing elements arranged to couple a feedback optical beam back into the quantum well gain medium from which an amplified beam arises thus forming an optical resonant cavity, and wherein the two opposing elements are separated by no more than about 30 millimeters.

15. The source of claim 12 wherein the thermally conductive substrate including a bulk substrate portion that is formed of material having a thermal conductivity of greater than about 100 W/mK.

16. The source of claim 12 wherein the thermally conductive substrate includes copper.

17. The source of claim 12 further comprising a lens positioned between the feedback element and the gain medium, the lens having a short focal length and a high numerical aperture.

18. A source comprising:
    a thermally conductive substrate having a thermal conductivity of greater than about 200 W/mK;
    a quantum well gain medium having a base side and an epi side, the epi side being directly bonded to the thermally conductive substrate, the gain medium further comprising a quantum well stack, waveguide layers, regrowth material, emission facets, and a bond layer; wherein the quantum well stack is comprised of a plurality of semiconductor layers forming quantum wells and barrier regions; wherein the waveguide layers are disposed on the epi side and the base side of the quantum well stack and are optically and electrically conductive; and wherein the bond layer is a metallic or electrically conductive layer disposed on one of the waveguide layers to form a bond between the gain medium and the thermally conductive substrate; and an optical resonator having at least one optical feedback element spatially removed from the gain medium, the optical feedback element including two opposing elements arranged to couple a feedback optical beam back into the quantum well gain medium from which an amplified beam arises thus forming an optical resonant cavity, and wherein the two opposing elements are separated by no more than about 30 millimeters.

19. The source of claim 18 wherein the gain medium includes a pair of opposed sides that extend between the base side and the epi side, wherein the regrowth material is an electrical insulator, and wherein the regrowth material is disposed on at least one of the opposing sides of the gain medium.

20. The source of claim 18 wherein the emission facets are planar surfaces formed in a natural plane of the quantum well stack operable for coupling of optical beams into and out of the gain medium.

21. The source of claim 18 wherein the thermally conductive substrate includes a carrier substrate portion that is formed of material having a thermal conductivity of greater than about 500 W/mK.

22. The source of claim 21 wherein the thermally conductive substrate including a bulk substrate portion that is formed of material having a thermal conductivity of greater than about 100 W/mK.

23. The source of claim 18 wherein the thermally conductive substrate has a thermal conductivity of between about 1500 and 2000 W/mK.

24. The source of claim 18 wherein the thermally conductive substrate includes copper.

* * * * *